United States Patent
Onozuka et al.

(10) Patent No.: US 9,502,367 B2
(45) Date of Patent: Nov. 22, 2016

(54) SEMICONDUCTOR DEVICE INCLUDING A CAP FACING A SEMICONDUCTOR CHIP AND A BUMP ELECTRODE PROVIDED BETWEEN THE SEMICONDUCTOR CHIP AND THE CAP

(71) Applicant: Kabushiki Kaisha Toshiba, Minato-ku (JP)

(72) Inventors: Yutaka Onozuka, Yokohama (JP); Hiroshi Yamada, Yokohama (JP); Nobuto Managaki, Kawasaki (JP); Tadahiro Sasaki, Nerima (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/642,120

(22) Filed: Mar. 9, 2015

(65) Prior Publication Data

US 2015/0279802 A1 Oct. 1, 2015

(30) Foreign Application Priority Data

Mar. 25, 2014 (JP) .................................. 2014-062044

(51) Int. Cl.
*H01L 23/48* (2006.01)
*H01L 23/495* (2006.01)
(Continued)

(52) U.S. Cl.
CPC ........... *H01L 24/16* (2013.01); *H01L 23/3121* (2013.01); *H01L 23/5384* (2013.01);
(Continued)

(58) Field of Classification Search
CPC .................. H01L 24/16; H01L 23/04; H01L 2224/13144; H01L 2224/16113; H01L 2224/16235; H01L 2924/01029; H01L 23/13; H01L 23/3114

USPC ........ 257/693, 782, 786, 778, 774, 675, 712
See application file for complete search history.

(56) References Cited

U.S. PATENT DOCUMENTS

| 8,119,932 B2* | 2/2012 | Sunohara ................ H01L 23/13 174/267 |
| 2005/0218497 A1* | 10/2005 | Komuro .............. H01L 21/6835 257/686 |
| 2010/0193946 A1* | 8/2010 | Suzuki ................ H01L 23/3114 257/737 |

(Continued)

FOREIGN PATENT DOCUMENTS

| JP | 2006-210745 A | 8/2006 |
| JP | 2008-40878 A | 2/2008 |

(Continued)

OTHER PUBLICATIONS

Naotaka Tanaka, et al., "Ultra-Thin 3D-Stacked SIP Formed Using Room-Temperature Bonding between Stacked Chips" Electronic Components and Technology Conference, 2005, pp. 788-794.

*Primary Examiner* — A. Sefer
*Assistant Examiner* — Dilinh Nguyen
(74) *Attorney, Agent, or Firm* — Oblon, McClelland, Maier & Neustadt, L.L.P.

(57) ABSTRACT

A semiconductor device according to an embodiment includes a semiconductor chip, a cap disposed to face the semiconductor chip, and having a through-hole electrode arranged in a through hole, and a bump electrode provided between the semiconductor chip and the cap, wherein the bump electrode is in a protruding shape connecting the semiconductor chip and the through-hole electrode, and wherein at least a portion of the bump electrode is included in the through-hole electrode, and electrically connected thereto, so that the adhesive performance between the cap and the bump electrode can be increased.

9 Claims, 10 Drawing Sheets

(51) Int. Cl.
  *H01L 23/34* (2006.01)
  *H01L 23/52* (2006.01)
  *H01L 29/40* (2006.01)
  *H01L 23/00* (2006.01)
  *H01L 23/31* (2006.01)
  *H01L 23/538* (2006.01)

(52) U.S. Cl.
  CPC ....... *H01L23/5389* (2013.01); *H01L 23/5385* (2013.01); *H01L 2224/13144* (2013.01); *H01L 2224/16113* (2013.01); *H01L 2224/16235* (2013.01); *H01L 2924/01029* (2013.01); *H01L 2924/181* (2013.01)

(56) References Cited

U.S. PATENT DOCUMENTS

2013/0119501 A1* 5/2013 Yoshida .............. H01L 23/3114
                                                                 257/435

FOREIGN PATENT DOCUMENTS

| JP | 2008-85552 A | 4/2008 |
| JP | 4559993 B2 | 10/2010 |
| JP | 2012-75803 A | 4/2012 |
| JP | 2012-190855 A | 10/2012 |
| JP | 2012-209424 A | 10/2012 |
| JP | 2013-4754 A | 1/2013 |

* cited by examiner

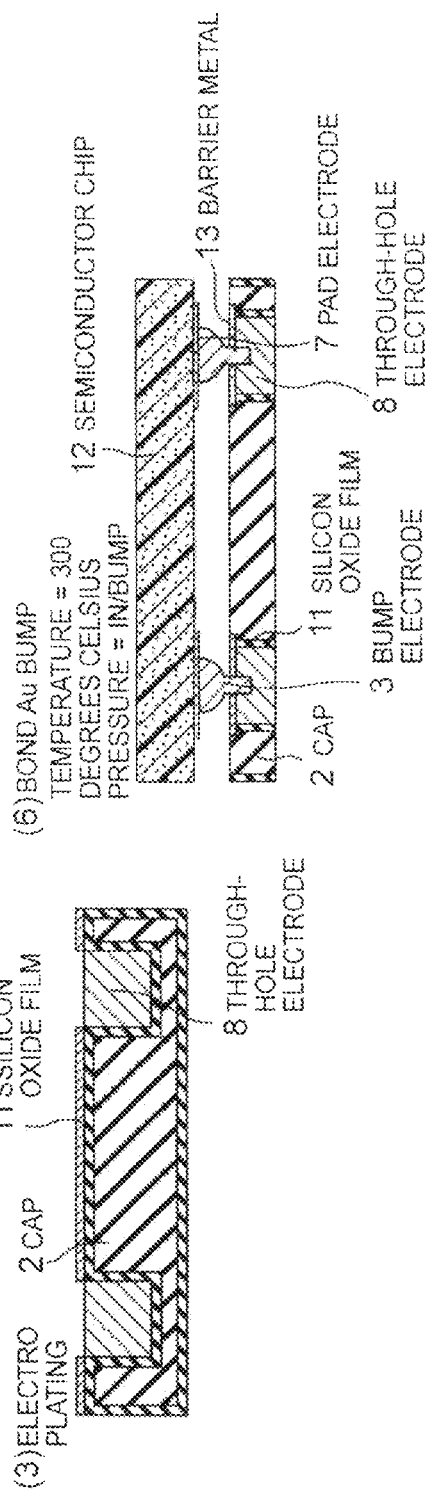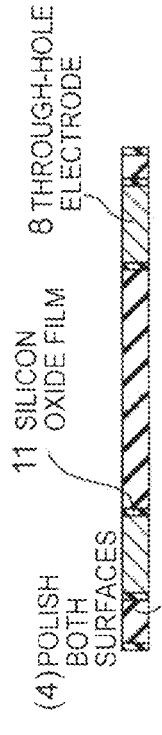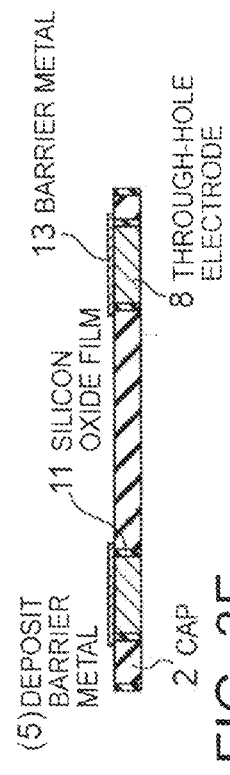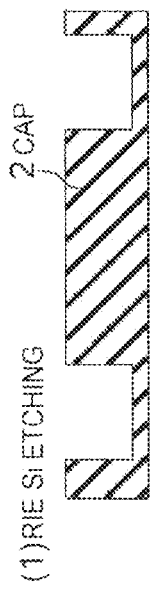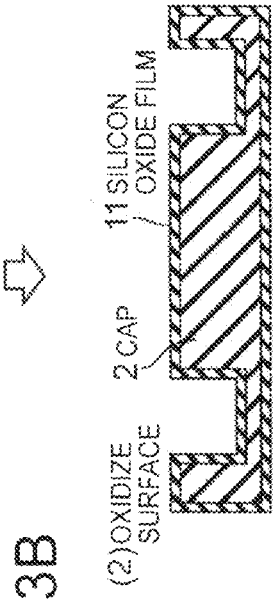

SEMICONDUCTOR DEVICE INCLUDING A CAP FACING A SEMICONDUCTOR CHIP AND A BUMP ELECTRODE PROVIDED BETWEEN THE SEMICONDUCTOR CHIP AND THE CAP

CROSS-REFERENCE TO RELATED APPLICATIONS

This application is based upon and claims the benefit of priority from the Japanese Patent Application No. 2014-062044, filed on Mar. 25, 2014; the entire contents of which are incorporated herein by reference.

FIELD

An embodiment of the invention generally relates to a semiconductor device.

BACKGROUND

With the advent of ubiquitous society, expectation is rising for small electronic devices having wireless communication functions which are typically portable information terminals such as a cellular phone and a PDA. Therefore, smaller and lighter electronic devices have been researched, but in order to further respond to various kinds of needs in the future, a demand for increasing the functions and enhancing the performance thereof is expected to still further increase. Especially, high frequency devices are required to be integrated in a wireless communication device.

In this case, a conventional semiconductor device for the purpose of integrating high frequency devices has a problem in that the adhesive property between a cap and a bump electrode is weak, and high frequency devices are separated at a bonding surface between a barrier metal and a pad electrode.

BRIEF DESCRIPTION OF THE DRAWINGS

FIGS. 3A to 3F are step views illustrating a method for producing the semiconductor device according to the first embodiment.

DETAILED DESCRIPTION

Embodiments will be hereinafter explained with reference to drawings.

First Embodiment

The semiconductor device according to the first embodiment will be hereinafter explained with reference to drawings.

Figure 1:
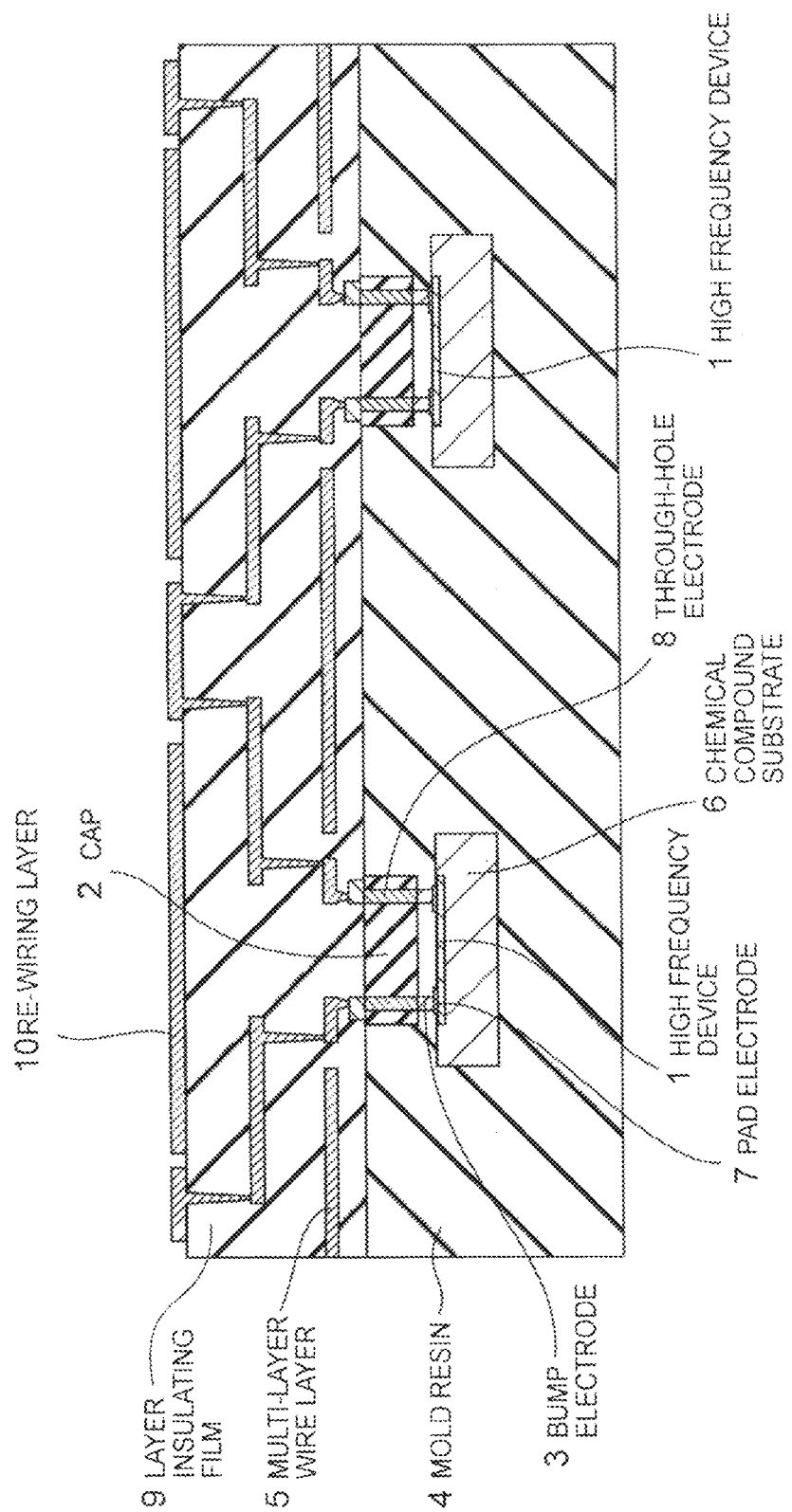
FIG. 1 is a cross sectional view illustrating a semiconductor device according to a first embodiment.

First, a configuration of a semiconductor device according to the first embodiment will be explained with reference to FIG. 1. FIG. 1 is a cross sectional view illustrating the semiconductor device according to the first embodiment.

As shown in FIG. 1, the semiconductor device according to the first embodiment includes multiple high frequency devices 1, and each of the multiple high frequency devices 1 is sealed via a bump electrode 3 with a cap 2 in a hollow manner. Each of the high frequency devices 1 is formed on a chemical compound substrate 6 such as GaAs, and has at least a pair of pad electrodes 7 made of Au and the like.

On the other hand, the cap 2 is made of high resistance silicon and the like and includes at least a pair of through-hole electrodes 8 filled with Cu and the like at the positions corresponding to the pad electrodes 7. In the high frequency device 1 and the cap 2 of each pair, the pad electrode 7 and the through-hole electrode 8 are bonded via the bump electrode 3 made of AuSn solder, Au Stud Bump, and the like so as to make an interval of about 50 to 100 µm, and this high frequency device 1 is sealed in a hollow manner.

Multiple high frequency devices 1 sealed in a hollow manner are rearranged in a row with a predetermined distance therebetween, and thereafter, the high frequency devices 1 are sealed with a mold resin 4 made of epoxy resin and the like, thus being configured as a restructured wafer. A layer insulating film 9 made of polyimide and the like and a re-wiring layers 10 made of Al/Ti thin film are alternately formed on this restructured wafer, so that a multi-layer wire layer 5 is formed.

In this manner, the high frequency device 1 is sealed by the cap 2 in a hollow manner, and further sealed in the mold resin 4, and further a signal of the high frequency device 1 formed with the multi-layer wire layer 5 is controlled from the outside via the pad electrode 7, the bump electrode 3, the through-hole electrode 8, and the re-wiring layer 10.

Figures 2A, 2B:
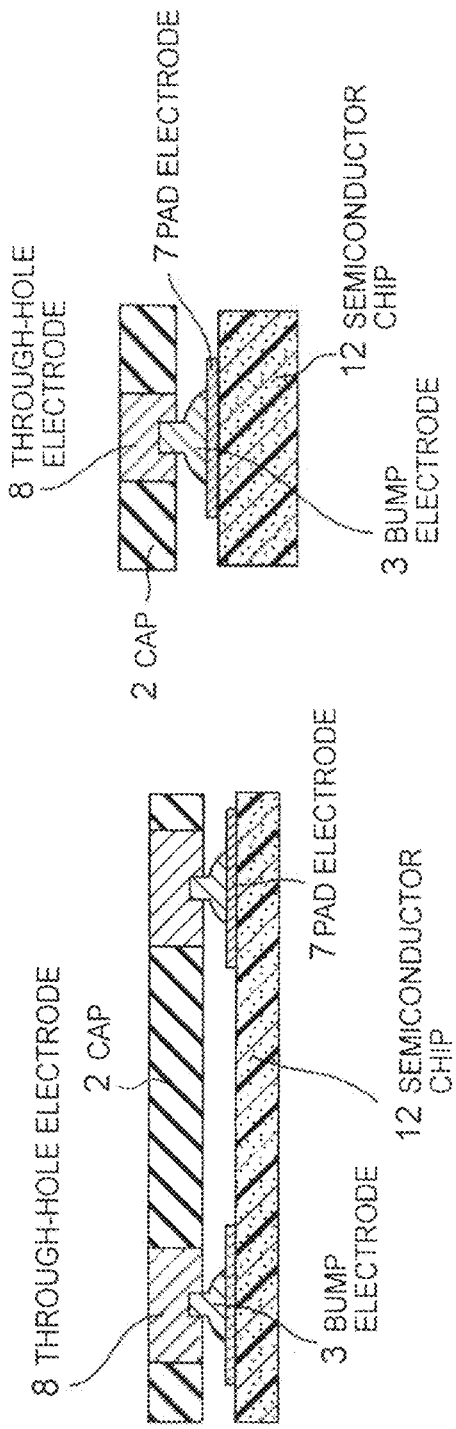
FIGS. 2A and 2B are partially enlarged cross sectional views illustrating the semiconductor device according to the first embodiment.

Subsequently, overview of the semiconductor device according to the first embodiment will be explained with reference to FIGS. 2A and 2B. FIG. 2A is a partially enlarged view illustrating a semiconductor device according to the first embodiment. FIG. 2B is a view seen in a direction 90 degrees rotated from FIG. 2A.

As shown in FIGS. 2A and 2B, the bump electrode 3 in the protruding shape made of metal provided on the pad electrode 7 includes a protruding distal end portion and a bottom portion wider than the distal end portion. This distal end portion is pressed into the through-hole electrode 8 of the cap 2, so that the through-hole electrode 8 is deformed, whereby the cap 2 and the through-hole hole electrode 8 are bonded.

Subsequently, the method for producing the semiconductor device according to the first embodiment will be explained with reference to FIGS. 3A to 3F. FIGS. 3A to 3F are step views illustrating the method for producing the semiconductor device according to the first embodiment.

First, as shown in FIG. 3A, a trench structure of which thickness is about 200 μm is formed by reactive ion etching method (RIE) in the cap 2 having high resistance silicon (the thickness of the substrate is about 400 μm).

Subsequently, as shown in FIG. 3B, the surface of the cap 2 including a trench structure is oxidized under a high temperature of about 1100 degrees Celsius, and the silicon oxide film 11 is formed about 1 nm.

Further, as shown in FIG. 3C, the through-hole electrode 8 (about 50 μm) is formed in a trench structure portion in a liquid obtained by mixing copper sulfate, sulfuric acid, and additive by electroplating method.

As shown in FIG. 3D, using the polishing device, the through-hole electrode 8 (about 50 μm) deposited on the surface of the cap 2 is removed. In the polishing, first, the cap 2 is polished by being pressed against the polishing board of which polishing surface of a roughness of about #600 is rotated 240 rpm, and thereafter, in a polishing liquid including alumina fine particles, and then it is carried out by a polishing board of a roughness of #1000. Further, using a grinding device, the silicon on the back surface of the cap 2 is grinded about 300 μm with a grindstone of which roughness is #230, and the through-hole electrode 8 is exposed, and thereafter, using the polishing device, surface polishing is carried out with a grindstone of roughness #600.

As shown in FIG. 3(e), a resist pattern (thickness about 2 μm) is formed by photolithography method. Subsequently, using a sputtering device, a barrier metal layer (Au/Ni/Ti: 0.2 μm/0.3 μm/0.1 μm) is formed on this resist pattern. Further, with acetone ultrasonic processing, the barrier metal layer on the resist pattern is separated by so-called lift-off method, and the barrier metal 13 is formed on the through-hole electrode 8. This barrier metal 13 is formed to prevent the surface oxidization of Cu of the through-hole electrode 8.

As shown in FIG. 3F, on the semiconductor chip 12 (GaAs chip), the bump electrodes 3 are formed on the predetermined pad electrodes 7 using a wire bonding device with a implementation temperature of 200 degrees Celsius, and an ultrasonic electric current of 50 mA to 80 mA. The semiconductor chip 12 having the bump electrodes 3 formed thereon is thermocompression-bonded to the cap 2 formed with the barrier metal 13 under a condition of a stage temperature of 200 degrees Celsius, a tool temperature of 300 degrees Celsius, a tool pressure 1N/bump, and a thermocompression time of 20 seconds, so that the bump electrode 3 and the through-hole electrode 8 of the cap 2 are bonded.

In the semiconductor device according to the first embodiment, when the barrier metal 13 is not formed in FIG. 3B, the oxide film layer of Cu is thinly formed on the surface of the through-hole electrode 8, but even in such case, the bump electrode 3 penetrates through the oxide film layer, and is pressed into the through-hole electrode 8.

Figure 4A:
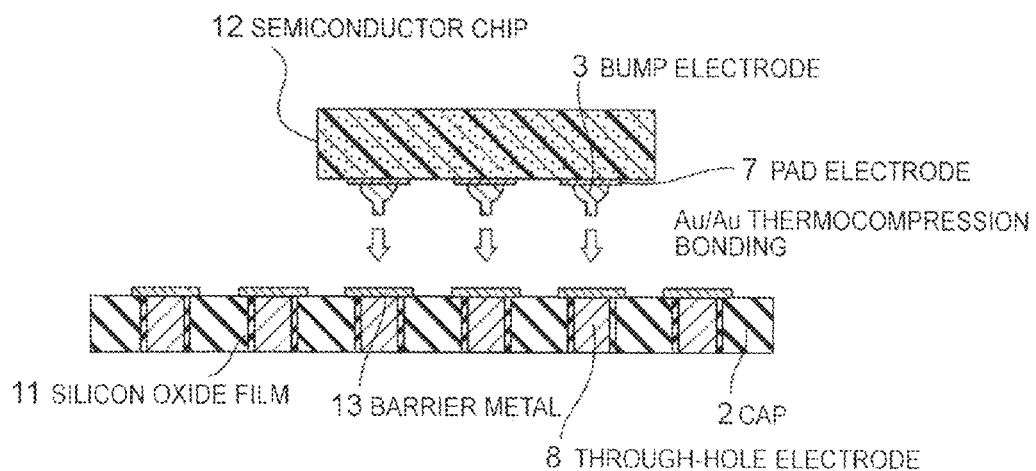
FIGS. 4A and 4B are figures illustrating an experiment result of a bonding step of force fitting a bump electrode of the semiconductor device according to the first embodiment.
Figure 4B:
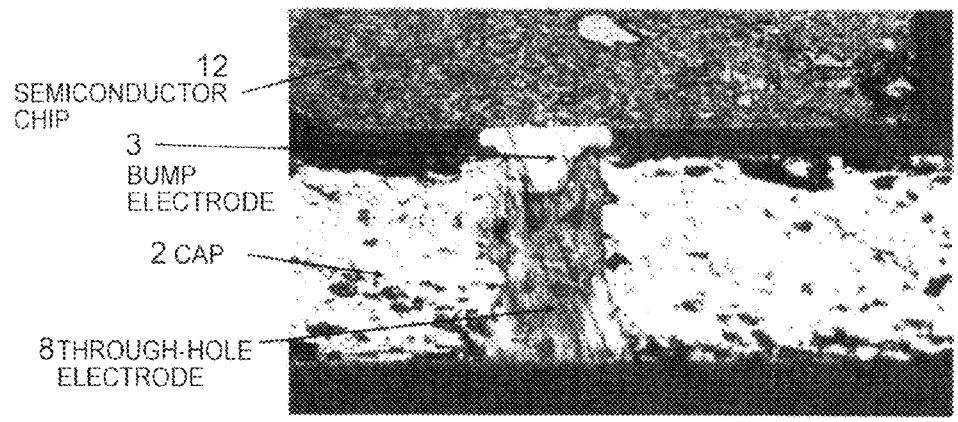

Further, an experiment result of the bonding step of pressing-in of the bump electrode in the semiconductor device according to the first embodiment will be explained with reference to FIGS. 4A and 4B. FIGS. 4A and 4B are figures illustrating an experiment result of a bonding step of pressing-in of a bump electrode in the semiconductor device according to the first embodiment.

As shown in FIG. 4A, on the semiconductor chip 12 (GaAs chip), the bump electrodes 3 which are protruding shape electrodes are formed on the predetermined pad electrodes 7 using a wire bonding device with a implementation temperature of 200 degrees Celsius, and an ultrasonic electric current of 50 mA to 80 mA. The bump electrodes 3 are made of Au including about 0.5 to 5% of Pd in order to improve the hardness.

The cap 2 includes the through-hole electrode 8, the silicon oxide film 11, and the barrier metal 13. The through-hole electrode 8 is filled with Cu, and the silicon oxide film 11 is formed on the side surface thereof. In this case, the silicon oxide film 11 is formed to hold the insulating property between the through-hole electrodes 8. Further, the barrier metal 13 is formed on the through-hole electrode 8. In this case, after Cu is filled in the through-hole electrode 8, the barrier metal 13 is formed to prevent the Cu surface from being oxidized.

In this case, as shown in FIG. 4B, the bump electrode 3 and the through-hole electrode 8 of the cap 2 are bonded by thermocompression. This thermocompression is carried out using a flip chip bonder with a pressure=1N/bump, a thermocompression time of 20 seconds, a tool temperature of 250 degrees Celsius, and a stage temperature of 200 degrees Celsius. When FIG. 3B is observed, the protruding portion of the bump electrode 3 which is the electrode in the protruding shape can be found to be pressed into the through-hole electrode 8 by a depth of about 30 μm to 50 μm.

Figure 5:
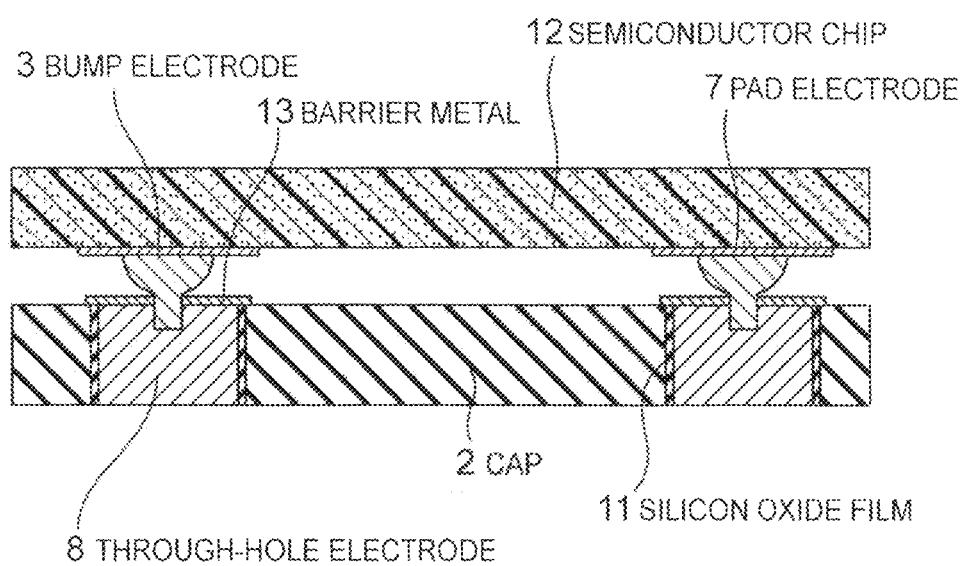
FIG. 5 is a configuration diagram after a bump electrode and a cap are bonded in the semiconductor device according to the first embodiment.

FIG. 5 is configuration diagram after the bump electrode and the cap are bonded in the semiconductor device according to the first embodiment.

As shown in FIG. 5, the bump electrode 3 which is the protruding shape electrode penetrates through the barrier metal 13 and pressed into the through-hole electrode 8 filled with Cu. The barrier metal 13 is for the purpose of preventing the surface of the through-hole electrode 8 filled with Cu from being oxidized, and therefore, when the bump electrode 3 penetrates through the barrier metal 13 and pressed into the through-hole electrode 8, no problem would occur even if the barrier metal 13 is destroyed.

The phenomenon for embedding the bump electrode 3 into the through-hole electrode 8 is caused by the fact that the hardness of the bump electrode 3 is harder than the through-hole electrode 8. More specifically, the Vickers hardness of the bump electrode 3 made of Au including 5% of Pd or less is 80 Hv, whereas the Vickers hardness of Cu filled in the through-hole electrode 8 is about 70 Hv.

Figure 6A:
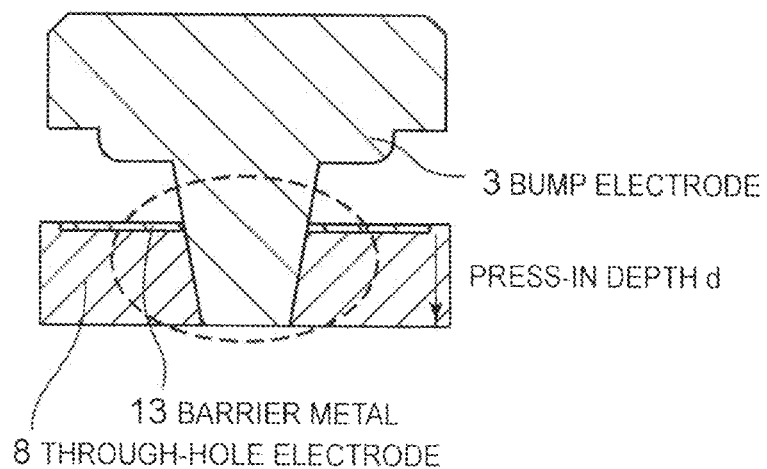
FIGS. 6A and 6B are graphs illustrating a relationship of a press-in depth of a bump electrode and a bonding strength between a bump electrode and a through-hole electrode of the semiconductor device according to the first embodiment.
Figure 6B:
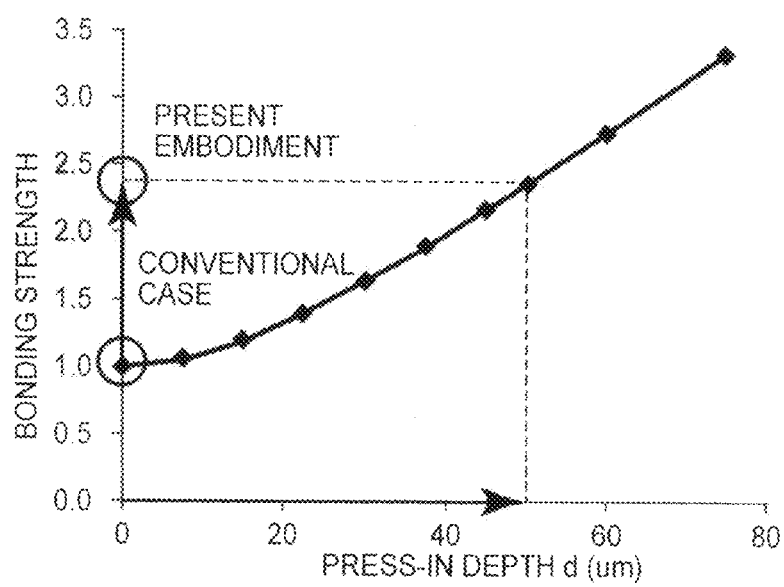

Further, a relationship of a press-in depth of a bump electrode and a bonding strength between a bump electrode and a through-hole electrode of the semiconductor device according to the first embodiment will be shown with reference to FIGS. 6A and 6B. FIGS. 6A and 6B are graphs illustrating a relationship of a press-in depth of a bump electrode and a bonding strength between a bump electrode and a through-hole electrode of the semiconductor device according to the first embodiment.

As shown in FIGS. 6A and 6B, about 2.3 times higher bonding strength can be obtained in a case where the press-in depth is 50 μm than in a case where the press-in depth is 0 μm. This is caused by an anchoring effect of the press-in and the increase in the size of area of contact between the bump electrode 3 and the through-hole electrode 8. With the anchoring effect of the press-in of the distal end portion of the bump electrode 3 into the through-hole electrode 8, the shear strength is improved, and this prevents failure of separation at the bonding portion between the cap 2 and the bump electrode 3, and thus, a highly reliable connection structure is achieved.

As described above, in the semiconductor device according to the first embodiment, multiple high frequency devices 1 are rearranged in proximity, further, the high frequency devices 1 are connected with the still finer re-wiring layer 10, so that multiple high frequency devices 1 can be integrated with a high density. Therefore, in the semiconductor device according to the first embodiment, on a single restructured wafer, more high frequency devices 1 can be provided, so that the cost of production can be reduced. Further, in the semiconductor device according to the first embodiment, the high frequency device 1 has a space from the cap 2 made of a high resistance silicon and the like, and therefore, this reduce interference between the high frequency device 1 and the cap 2, and the signal transmission can be done with a low loss, so that a high performance semiconductor module having multiple high performance high frequency devices 1 can be produced.

Second Embodiment

Figure 7:
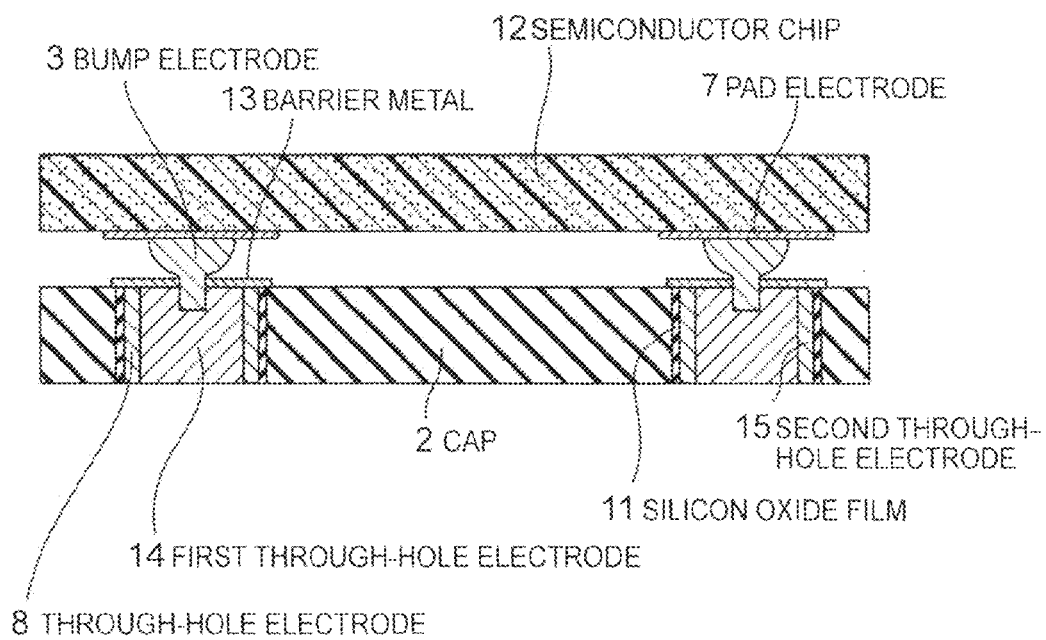
FIG. 7 is a configuration diagram after a bump electrode and a cap are bonded in a semiconductor device according to a second embodiment.

A semiconductor device according to the second embodiment will be hereinafter explained with reference to FIG. 7. The second embodiment is different from the first embodiment only in that the through-hole electrode 14 is different. Therefore, except the description of this through-hole electrode 14, the second embodiment is the same as the first embodiment, and therefore, the same elements are denoted with the same reference numerals, and detailed description thereabout is omitted. FIG. 7 is configuration diagram after the bump electrode and the cap are bonded in the semiconductor device according to the second embodiment.

As shown in FIG. 7, the structure of the through-hole electrode 8 is two-layer structure including a first through-hole electrode 14 filled with Cu of an ordinary density and a second through-hole electrode 15 filled with porous Cu of a lower density. In this case, when the bump electrode 3 is pressed into the second through-hole electrode 15 filled with the porous Cu, the second through-hole electrode 15 filled with the porous Cu is more greatly deformed than the first through-hole electrode 14, and therefore, the bump electrode 3 digs into the through-hole electrode 8 more deeply.

Subsequently, a method for producing the semiconductor device according to the second embodiment will be explained with reference to FIGS. 8A to 8G. FIGS. 8A to 8G are step views illustrating the method for producing the semiconductor device according to the second embodiment.

Figure 8:
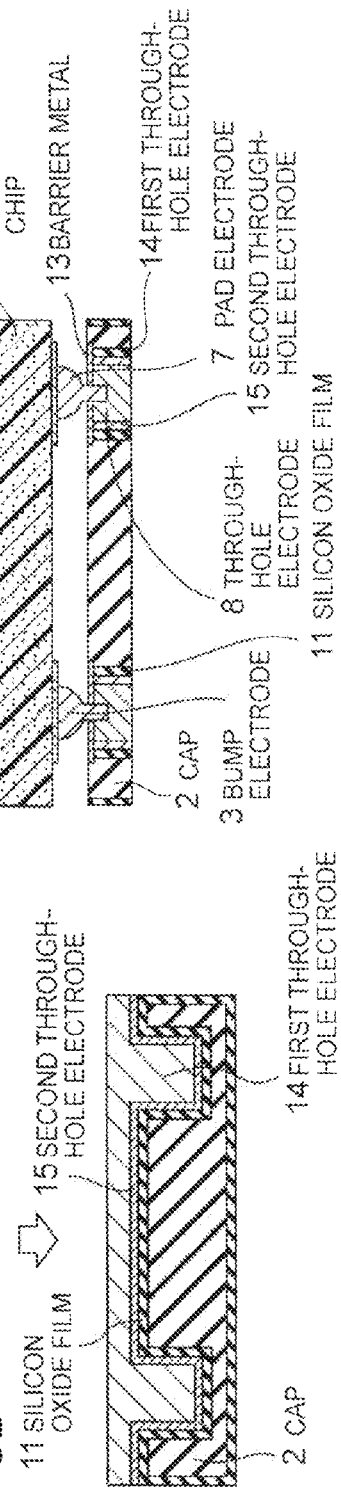
FIGS. 8A to 8G are step views illustrating a method for producing the semiconductor device according to the second embodiment.

As shown in FIG. 8A, a trench structure of a depth of about 200 μm is formed by reactive ion etching method (RIE) in the cap 2 having a high resistance silicon (the thickness of the substrate is about 400 μm).

Subsequently, as shown in FIG. 8B, the surface of the cap 2 including the trench structure is oxidized under a high temperature of about 1100 degrees Celsius, and the silicon oxide film 11 is formed about 1 nm.

Further, as shown in FIG. 8C, using the sputtering device, the second through-hole electrode 15 (Cu/Ti which is about 3 μm/0.1 μm) is formed on the surface of the cap 2.

As shown in FIG. 8D, a metal film (Cu: about 50 μm) is formed in a trench structure portion in a liquid obtained by mixing copper sulfate, sulfuric acid, and additive by electroplating method. Further, on the second through-hole electrode 15 formed by the electroplating method, a porous first through-hole electrode 14 (about 1 μm) is formed in a mixed liquid including copper sulfate, sodium hypophosphite, boric acid, nickel sulfate, and additive by the electroless plating method. Thereafter, a metal film (Cu: about 50 μm) is formed in a liquid obtained by mixing copper sulfate, sulfuric acid, and additive by electroplating method. As a result, the porous first through-hole electrode 14 serving as the foundation can be made into a thicker film of 51 μm.

As shown in FIG. 8E, the first through-hole electrode 14 and the second through-hole electrode 15 (about 50 μm) deposited on the surface of the cap 2 are removed by the polishing device. In the polishing, first, the cap 2 is polished by being pressed against the polishing board of which polishing surface of a roughness of about #600 is rotated 240 rpm, and thereafter, in a polishing liquid including alumina fine particles, and then it is carried out by a polishing board of a roughness of #1000. Further, using a grinding device, the silicon on the back surface of the cap 2 is grinded about 300 μm with a grindstone of which roughness is #230, and the through-hole electrode 8 is exposed, and thereafter, using the polishing device, surface polishing is carried out with a grindstone of roughness #600.

As shown in FIG. 8F, a resist pattern (thickness about 2 μm) is formed by photolithography method. Subsequently, using a sputtering device, a barrier metal layer (Au/Ni/Ti: 0.2 μm/0.3 μm/0.1 μm) is formed on this resist pattern. Further, with acetone ultrasonic processing, the barrier metal layer on the resist pattern is separated by so-called lift-off method, and the barrier metal 13 is formed on the through-hole electrode 8. This barrier metal 13 is formed to prevent the surface oxidization of Cu of the through-hole electrode 8.

As shown in FIG. 8G, on the semiconductor chip 12 (GaAs chip), the bump electrodes 3 are formed on the predetermined pad electrodes 7 using a wire bonding device with a implementation temperature of 200 degrees Celsius, and an ultrasonic electric current of 50 mA to 80 mA. The semiconductor chip 12 having the bump electrodes 3 formed thereon is thermocompression-bonded to the cap 2 formed with the barrier metal 13 under a condition of a stage temperature of 200 degrees Celsius, a tool temperature of 300 degrees Celsius, a tool pressure 1N/bump, and a thermocompression time of 20 seconds, so that the bump electrode 3 and the through-hole electrode 8 of the cap 2 are bonded.

In the semiconductor device according to the second embodiment explained above, the inventors have confirmed that, after the bump electrode 3 and the cap 2 are bonded, the distal end portion of the bump electrode 3 penetrates through the barrier metal 13, and is inserted into the through-hole electrode 8. When the barrier metal 13 is not formed, the Cu oxide film layer is thinly formed on the surface of the through-hole electrode 8, but the bump electrode 3 penetrates through the oxide film layer, and is pressed into the through-hole electrode 8.

As described above, like the first embodiment, in the semiconductor device according to the second embodiment, multiple high frequency devices 1 are rearranged in proximity, further, the high frequency devices 1 are connected with the still finer re-wiring layer 10, so that multiple high frequency devices 1 can be integrated with a high density. Therefore, in the semiconductor device according to the second embodiment, on a single restructured wafer, more high frequency devices 1 can be provided, so that the cost of production can be reduced. Further, in the semiconductor device according to the second embodiment, the high frequency device 1 has a space from the cap 2 made of a high resistance silicon and the like, and therefore, this reduce interference between the high frequency device 1 and the cap 2, and the signal transmission can be done with a low loss, so that a high performance semiconductor module having multiple high performance high frequency devices 1 can be produced.

Further, with the semiconductor device according to the second embodiment, the anchoring effect is increased as compared with the first embodiment, and the bonding between the bump electrode 3 and the cap 2 can be achieved more strongly.

Third Embodiment

Figure 9:
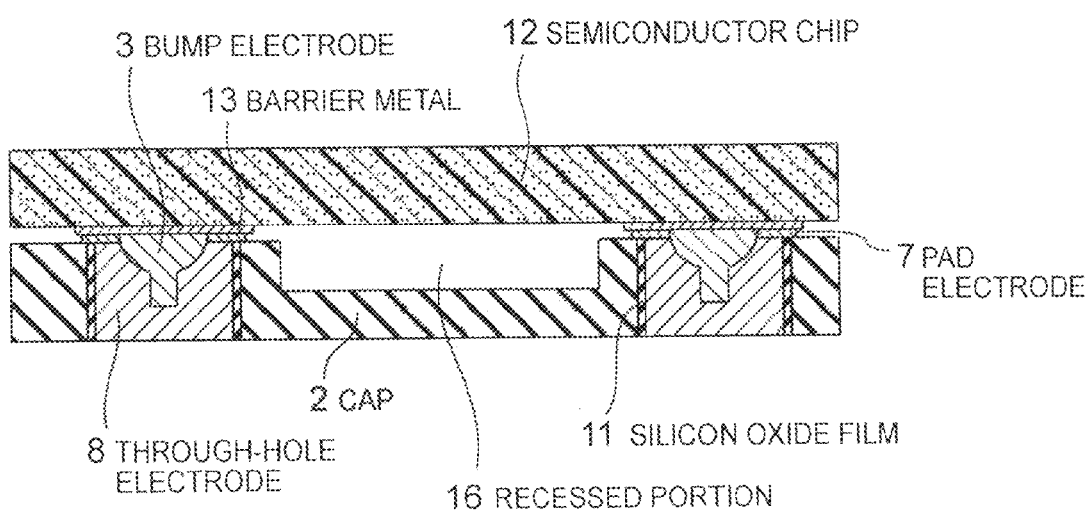
FIG. 9 is a configuration diagram after a bump electrode and a cap are bonded in a semiconductor device according to a third embodiment.

A semiconductor device according to the third embodiment will be hereinafter explained with reference to FIG. 9. The third embodiment is different from the first embodiment only in that a recessed portion 16 is different. Therefore, except the description of this recessed portion 16, the third embodiment is the same as the first embodiment, and therefore, the same elements are denoted with the same reference numerals, and detailed description thereabout is omitted. FIG. 9 is configuration diagram after the bump electrode and the cap are bonded in the semiconductor device according to the third embodiment.

As shown in FIG. 9, the semiconductor device according to the third embodiment includes a silicon oxide film 11 (film thickness is about 1 nm), a cap 2 having a high resistance silicon (substrate thickness is 300 μm), a through-hole electrode 8 filled with Cu, and a barrier metal 13 (Au/Ni/Ti: 0.2 μm/0.3 μm/0.1 μm), and a recessed portion 16 (first hollow portion) of which depth is about 100 μm is formed in a portion of the cap 2 and on the surface of the cap 2 facing the semiconductor chip 12. In the semiconductor device according to the third embodiment, the bump electrode 3 (height 80 μm) is formed on the semiconductor chip 12, and the entire bump electrode 3 is pressed into the through-hole electrode 8, so that the cap 2 and the bump electrode 3 are bonded. When the bump electrode 3 is pressed into the through-hole electrode 8, thermocompression is performed using a flip chip bonder with a tool pressure of 5N/bump, a thermocompression time of 20 seconds, a tool temperature of 350 degrees Celsius, and a stage temperature 300 degrees Celsius.

In the semiconductor device according to the third embodiment explained above, the inventors have confirmed that, after the bump electrode 3 and the cap 2 are bonded, the entire bump electrode 3 is inserted into the through-hole electrode 8. Further, the inventors have confirmed that a die shear strength evaluation indicates that the die shear strength has increased by twice or more as compared with a case where only the distal end portion of the protruding shape of the bump electrode 3 is pressed in.

As described above, like the first embodiment, in the semiconductor device according to the third embodiment, multiple high frequency devices 1 are rearranged in proximity, further, the high frequency devices 1 are connected with the still finer re-wiring layer 10, so that multiple high frequency devices 1 can be integrated with a high density. Therefore, in the semiconductor device according to the third embodiment, on a single restructured wafer, more high frequency devices 1 can be provided, so that the cost of production can be reduced. Further, in the semiconductor device according to the third embodiment, the high frequency device 1 has a space from the cap 2 made of a high resistance silicon and the like, and therefore, this reduce interference between the high frequency device 1 and the cap 2, and the signal transmission can be done with a low loss, so that a high performance semiconductor module having multiple high performance high frequency devices 1 can be produced.

Further, with the semiconductor device according to the third embodiment, the anchoring effect is increased as compared with the first embodiment and the second embodiment, and the bonding between the bump electrode 3 and the cap 2 can be achieved more strongly.

Fourth Embodiment

Figure 10:
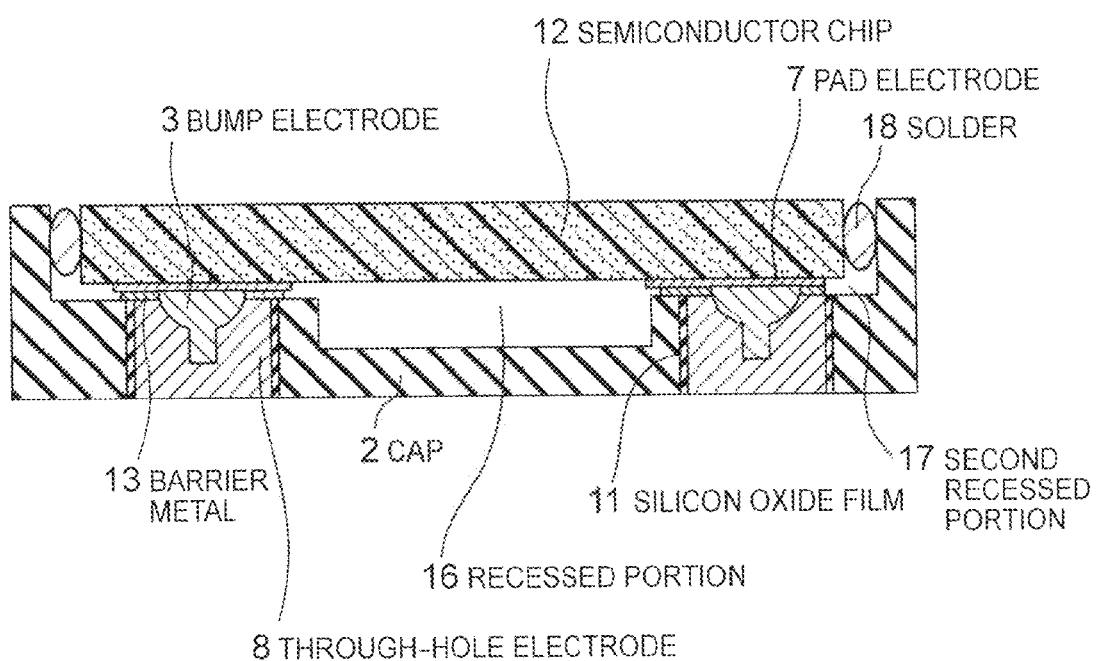
FIG. 10 is a configuration diagram after a bump electrode and a cap are bonded in a semiconductor device according to a fourth embodiment.

A semiconductor device according to the fourth embodiment will be hereinafter explained with reference to FIG. 10. The fourth embodiment is different from the third embodiment only in that a second recessed portion 17 (second hollow portion) and a solder 18 are different. Therefore, except the description of the second recessed portion 17 and the solder 18, the fourth embodiment is the same as the third embodiment, and therefore, the same elements are denoted with the same reference numerals, and detailed description thereabout is omitted. FIG. 10 is configuration diagram after the bump electrode and the cap are bonded in the semiconductor device according to the fourth embodiment.

As shown in FIG. 10, in the semiconductor device according to the fourth embodiment, in the cap 2 having the high resistance silicon, not only the recessed portion 16 but also the second recessed portion 17 are provided to be in two-stage structure. In this case, the second recessed portion is provided around the periphery of the side surface of the semiconductor chip 12. Further, in the semiconductor device according to the fourth embodiment, the solder 18 is formed between the side surface of the semiconductor chip 12 and the side surface of the second recessed portion 17 of the cap 2.

In this case, in the semiconductor device according to the fourth embodiment, when the bump electrode 3 is pressed into the through-hole electrode 8, thermocompression is performed using a flip chip bonder with a tool pressure of 5N/bump, a thermocompression time of 20 seconds, a tool temperature of 350 degrees Celsius, and a stage temperature 300 degrees Celsius. Further, after a thermosetting epoxy resin is injected into a side surface portion of the bump electrode 3 using a dispenser, it is cured at a heating temperature of 150 degrees Celsius and a heating time of 5 minutes, so that the side surface is sealed. Further, in the semiconductor device according to the fourth embodiment, the side surface is sealed using the solder 18. In this case, as compared with the semiconductor device according to the third embodiment, air tightness is significantly improved in the sealing of the side surface with the solder 18. Further, when a high-melting point solder (SnAgCu, AuSn, SnCu, and the like) is used for the solder 18, the heat resistivity is also improved. When the side surface is sealed with the solder 18, the bonding strength is strong, and therefore, the shock resistance is also improved.

As described above, like the first embodiment, in the semiconductor device according to the fourth embodiment, multiple high frequency devices 1 are rearranged in proximity, further, the high frequency devices 1 are connected with the still finer re-wiring layer 10, so that multiple high frequency devices 1 can be integrated with a high density. Therefore, in the semiconductor device according to the fourth embodiment, on a single restructured wafer, more high frequency devices 1 can be provided, so that the cost of production can be reduced. Further, in the semiconductor device according to the fourth embodiment, the high frequency device 1 has a space from the cap 2 made of a high resistance silicon and the like, and therefore, this reduce interference between the high frequency device 1 and the cap 2, and the signal transmission can be done with a low loss, so that a high performance semiconductor module having multiple high performance high frequency devices 1 can be produced.

Further, with the semiconductor device according to the fourth embodiment, the side surface is sealed with the solder 18, and therefore, as compared with the semiconductor device according to the third embodiment, the air tightness is significantly improved and the shock resistance is also improved.

According to the semiconductor device of any one of embodiments explained above, the distal end portion of the bump electrode 3 of the protruding shape provided on the semiconductor chip 12 is pressed into the through-hole electrode 8 and the cap 2 having the high resistance silicon, so that the through-hole electrode 8 is deformed and the bonding with the cap 2 is made, whereby the shear strength is improved due to the anchoring effect, and this prevents failure of separation at the bonding portion between the cap 2 and the bump electrode 3, and thus, a highly reliable connection structure is achieved.

It should be noted that the present invention is not limited to the embodiments explained above, and it is to be understood that the present invention may be modified in various manners.

In short, the present invention is not limited to the embodiments explained above as they are. When the present invention is carried out, it can be embodied upon modifying constituent elements without deviating from the gist thereof. Multiple constituent elements disclosed in the embodiments can be combined appropriately, and various modes may be formed. For example, some of constituent elements may be omitted from all the constituent elements disclosed in the embodiments. Further, constituent elements in different embodiments may be appropriately combined.

What is claimed is:

1. A semiconductor device comprising:
   a semiconductor chip;
   a cap disposed to face the semiconductor chip, and having a through-hole electrode arranged in a through hole; and
   a bump electrode provided between the semiconductor chip and the cap, wherein the bump electrode is in a protruding shape connecting the semiconductor chip and the through-hole electrode, the bump electrode including a protruding distal end portion and a bottom portion wider than the distal end portion,
   wherein at least a portion of the bump electrode is included in the through-hole electrode, and electrically connected thereto, and
   wherein the distal end portion of the bump electrode is pressed into the through-hole electrode of the cap, so that the through-hole electrode is deformed, whereby the cap and the through-hole electrode are bonded.

2. The semiconductor device according to claim 1, wherein a Vickers hardness of the bump electrode is more than a Vickers hardness of the through-hole electrode.

3. The semiconductor device according to claim 1, wherein a first hollow portion is provided between the semiconductor chip and the cap.

4. The semiconductor device according to claim 3, wherein a second hollow portion is further provided on a periphery of a side surface of the semiconductor chip.

5. The semiconductor device according to claim 4, wherein a solder is provided in the second hollow portion.

6. The semiconductor device according to claim 5, wherein a material of the bump electrode includes Au.

7. The semiconductor device according to claim 5, wherein a material of the through-hole electrode includes Cu.

8. The semiconductor device according to claim 5, wherein a barrier metal is included in at least a portion between the bump electrode and the through-hole electrode.

9. The semiconductor device according to claim 5, wherein a silicon oxide film is formed on a side surface of the through-hole electrode.

* * * * *